United States Patent
Boerner et al.

[11] Patent Number: 5,955,836
[45] Date of Patent: Sep. 21, 1999

[54] ORGANIC ELECTROLUMINESCENT COMPONENT WITH EXCIPLEX FORMED FROM A MIXED LAYER OF A MIXTURE OF HOLE TRANSPORTING AND ELECTRON TRANSPORTING ORGANIC MATERIAL

[75] Inventors: Herbert Boerner, Aachen; Wolfgang Busselt, Roetgen; Thomas Jüstel; Hans Nikol, both of Aachen, all of Germany

[73] Assignee: U.S. Philips Corporation, New York, N.Y.

[21] Appl. No.: 08/933,292

[22] Filed: Sep. 18, 1997

[30] Foreign Application Priority Data

Sep. 21, 1996 [DE] Germany .............. 196 38 770

[51] Int. Cl.⁶ .............. B32B 9/00; H05B 33/14
[52] U.S. Cl. ............ 313/506; 313/503; 313/504
[58] Field of Search ................ 313/504, 506, 313/502, 507, 512, 503; 428/690, 691, 917

[56] References Cited

U.S. PATENT DOCUMENTS

| | | | |
|---|---|---|---|
| 4,720,432 | 1/1988 | Vanslyke et al. | 428/457 |
| 5,281,489 | 1/1994 | Mori et al. | 313/504 |
| 5,716,722 | 2/1998 | Hamada et al. | 313/502 |

FOREIGN PATENT DOCUMENTS 07085972 3/1995 Japan .............. H05B 33/14

OTHER PUBLICATIONS

"Electroluminescence of Molecularly–Doped Polymer Films Using Coumarin Derivative as an Emissive Center", Ching–Piao Lin, Tetsuo Tsutsui and Shogo Saito, Journal of Polymer Research vol. 2, No. 3 133–138, Jul. 1995.

Polymer Light–Emitting Diodes with Single–and Double–Layer Structures Using Poly (2, 3–Diphenylquinoxaline–5, 8–Diyl), Takakazu Yamamoto, Tetsuji Inoue and Takaki Kanbara, Japanese Journal of Applied Physics, Part 2 (Letters), Feb. 15, 1994, pp. 250–253.

*Primary Examiner*—Sandra O'Shea
*Assistant Examiner*—Joseph Williams
*Attorney, Agent, or Firm*—Ernestine C. Bartlett

[57] ABSTRACT

An organic electroluminescent component with a transparent substrate, a first transparent electrode, a mixed layer comprising a light-emitting exciplex formed by a mixture of a hole transporting and electron transporting organic material, and a second electrode, where no further substances are used besides the hole transporting and the electron transporting compounds in which the redox processes serving for the charge transport are reversible, has a low operating voltage accompanied by a high luminance thanks to the simple layer structure. It has a long lifetime.

10 Claims, 6 Drawing Sheets

ORGANIC ELECTROLUMINESCENT COMPONENT WITH EXCIPLEX FORMED FROM A MIXED LAYER OF A MIXTURE OF HOLE TRANSPORTING AND ELECTRON TRANSPORTING ORGANIC MATERIAL

BACKGROUND OF THE INVENTION

The invention relates to an organic electroluminescent component with a transparent substrate, a first transparent electrode, an organic electroluminescent layer, and a second electrode.

Electroluminescent components built up from organic layers are of major importance because they can be manufactured in the form of large-area displays which can be operated at low voltages and which have a short response time and a low weight. They can also be manufactured in the form of flexible foils which are more widely applicable than traditional electroluminescent components made from inorganic semiconductor material. Fields of application for organic electroluminescent components accordingly are displays of all kinds, in particular also flat monitors and picture screens. The components are suitable for use as light sources in airplanes and spaceships because of their low weight. A further possibility is for these components to be used as laser diodes.

Traditional organic electroluminescent components usually have a layer structure comprising several separate layers. An organic electroluminescent component is known, for example, from U.S. Pat. No. 4,720,432 and comprises in that order an anode, an organic hole injecting and transporting zone, an organic electron injecting and transporting zone, and a cathode, and which is characterized in that the hole injecting and transporting zone comprises a layer which is in contact with the anode and which contains a hole injecting porphyrinic compound, and furthermore comprises a layer which contains a hole transporting aromatic tertiary amine and which lies between the hole injecting layer and the electron injecting and transporting zone.

Such multiple combinations of layers with charge injecting and charge transporting organic materials necessarily have many interfaces. The transition voltages at the interfaces lead to an undesirable increase in the operating voltage, a reduction in the current density, and a reduction in the brightness of the electroluminescent component.

It is accordingly an object of the present invention to provide an organic electroluminescent component which has a simple layer structure.

SUMMARY OF THE INVENTION

According to the invention, this object is achieved by means of an organic electroluminescent component with a transparent substrate, a first transparent electrode, an organic electroluminescent layer which is a mixed layer comprising a mixture of a hole transporting and an electron transporting organic material which forms an exciplex, and a second electrode.

Combinations of a hole transporting material and an electron transporting material which form a light-emitting exciplex are chosen for the mixed layer. The functions of hole transport, electron transport and light emission can thus be combined in a single layer which in the simplest embodiment is composed of no more than two different charge transporting compounds. The use of additional emitter compounds is dispensed with according to the invention. A simpler layer structure is thus achieved for the organic electroluminescent component, which is characterized by improved operational properties, in particular a low operating voltage and a high luminance at low voltage. The components have a long useful life because no further compounds are used besides the hole transporting and the electron transporting compounds, in which the redox processes serving for the charge transport are reversible. The components show no self-absorption and no absorption in the visible range of the spectrum.

It is preferred within the scope of the present invention that the mixture forming an exciplex comprises as the hole transporting material one or several compounds from the group 4,4',4"-tris(3-methylphenylphenylamino)-triphenylamine (MTDATA), N,N'-diphenyl-N,N'-bis(3-methylphenyl)-1,1'-biphenyl-4,4'-diamine (TPD), N,N'-di(4-methylphenyl)-N,N'-diphenyl-1,4-phenylenediamine (DPPD), and 1,1'-bis-(4'-bis-(4'-methylphenyl)-aminophenyl)-cyclohexane (TDAPC), and as the electron transporting material one or several compounds from the group 2-(4-biphenylyl)-5-(tert.-butylphenyl)-1,3,4-oxadiazole (butyl-PBD), 2-(4-biphenylyl)-5-phenyl-1,3,4-oxadiazole (PBD), and 5-(4-biphenylyl)-3-(tert.-butylphenyl)-1,2,4-triazole (TAZ).

These compounds form exciplexes in pairs, i.e. electronically excited complexes are created through interaction between the two compounds in one addition compound, which complexes are dissociated in the ground state but have a weak chemical bond in the excited state. The emission spectrum is changed by the exciplex formation. The emission lines of the individual compounds disappear and a broad, characteristic emission arises which is shifted into the low-frequency range compared with the individual components.

It is particularly preferred within the scope of the present invention that the hole transporting material is 4,4',4"-tris (3-methylphenylphenylamino)-triphenylamine (MTDATA) and the electron transporting material is 5-(4-biphenylyl)-3-(tert.-butylphenyl)- 1,2,4-triazole (TAZ).

Another embodiment of the invention is characterized in that a layer of a hole transporting organic material is arranged between the first electrode and the mixed layer.

A further embodiment of the invention is characterized in that a layer of an electron transporting organic material is arranged between the second electrode and the mixed layer.

A particularly preferred embodiment of the invention is characterized in that a layer of a hole transporting organic material is arranged between the first electrode and the mixed layer, and a layer of an electron transporting organic material is arranged between the second electrode and the mixed layer.

The arrangement of the mixed layer between purely hole transporting and/or electron transporting substances prevents a throughput of the charge carriers via the electrodes without radiation generation. An improved recombination of the charge carriers and a higher luminous efficacy are thus achieved.

BRIEF DESCRIPTION OF DRAWING

The invention will be explained in more detail below with reference to ten Figures.

DESCRIPTION OF THE PREFERRED EMBODIMENTS

The organic electroluminescent component according to the invention in its simplest embodiment comprises a substrate layer 1, a first transparent electrode layer 2, a mixed layer 3, and a second electrode 4.

Figure 1:
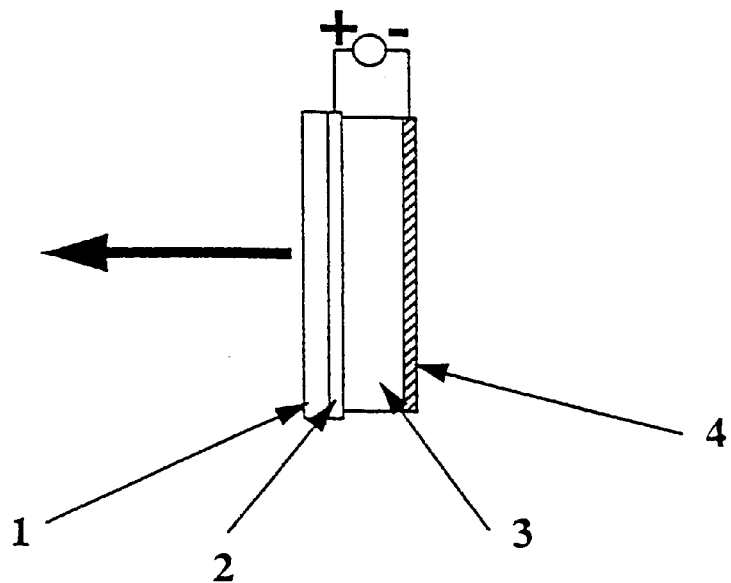
FIG. 1 shows an embodiment of the invention with a single mixed layer.
Figure 2:
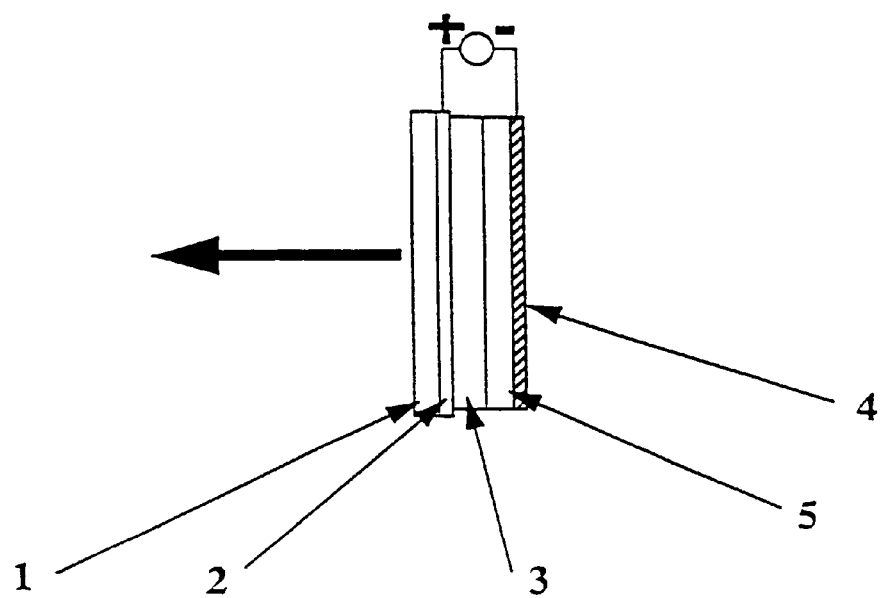
FIG. 2 shows an embodiment of the invention with a mixed layer and an electron transporting layer.

In another embodiment, shown in FIG. 2, an electron transporting layer 5 is present between the mixed layer 3 and the second electrode 4.

Figure 3:
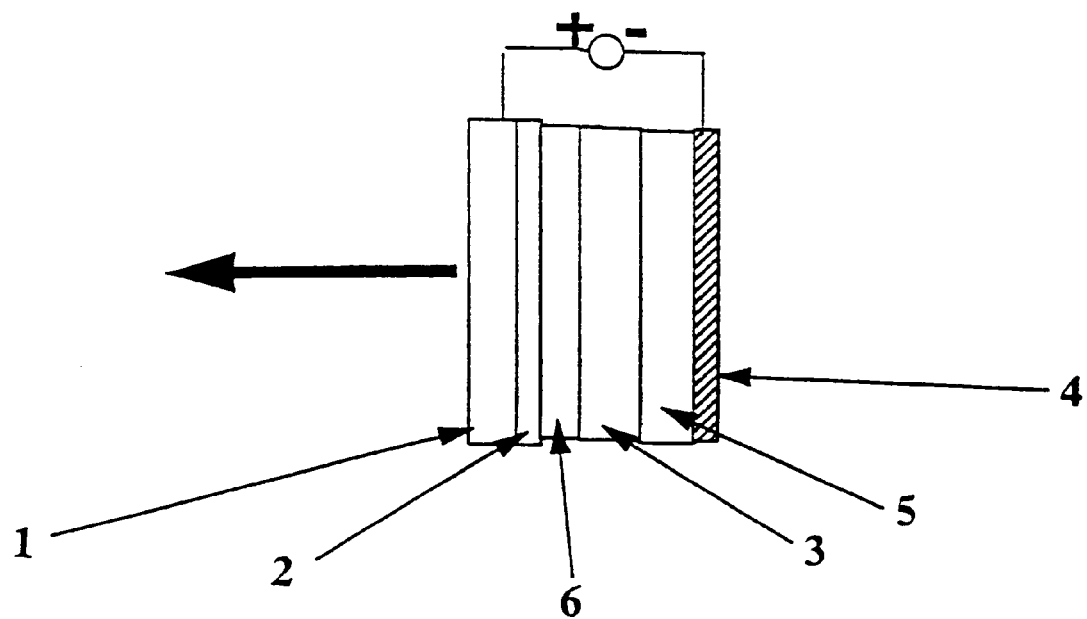
FIG. 3 shows an embodiment of the invention with a mixed layer, an electron transporting layer, and a hole transporting layer.

A further embodiment, shown in FIG. 3, comprises three separate layers which are optoelectronically active: a hole transporting layer 6, a mixed layer 3, and an electron transporting layer 5.

A plate of a light-transmitting material, for example a glass plate, always serves as the substrate 1. A thin film of a few 100 nm thickness is provided thereon as the anode 2, which should also be light-transmitting. This is followed by, if applicable, the hole transporting layer having a layer thickness of 100 nm to 2000 nm, preferably 500 nm, the mixed layer with a layer thickness of 100 nm to 2000 nm, preferably 200 nm, and possibly the electron transporting layer with a layer thickness of 100 nm to 2000 nm, preferably 500 nm.

The organic electroluminescent component is completed with the cathode 4.

Metals, metal oxides, or electrically conductive organic polymers having a high work function for electrons are suitable for use as the material for the transparent anode from which holes are injected into the p-type conducting layer. Examples are thin, transparent layers of indium-doped tin oxide (ITO), gold, and polyaniline.

Combinations of hole transporting and electron transporting compounds, which form exciplexes, are used for the mixed layer. These are, for example, combinations of 4,4',4"-tris(3-methylphenylphenylamino)-triphenylamine (MTDATA) or N,N'-di(4-methylphenyl)-N,N'-diphenyl-1,4-phenylenediamine (DPPD) with 2-(4-biphenylyl)-5-(tert.-butylphenyl)-1,3,4-oxadiazole (butyl-PBD), 2-(4-biphenylyl)-5-phenyl-1,3,4-oxadiazole (PBD), or 5-(4-biphenylyl)-3-tert.-butylphenyl)-1,2,4-triazole (TAZ). The combination of MTDATA with PBD or butyl-PBD is preferred.

Preferably, conductive triphenylamine derivatives are used for the hole transporting layer which is in contact with the anode and the mixed layer, such as 4,4',4"-tris(3-methylphenylphenylamino)-triphenylamine (MTDATA), N,N'-diphenyl-N,N'-bis(3-methylphenyl)-1,1'-biphenyl-4,4'-diamine (TPD), N,N'-di(4-methylphenyl)-N,N'-diphenyl-1,4-phenylenediamine (DPPD), or 1,1'-bis-(4'-bis-(4'-methylphenyl)-aminophenyl)-cyclohexane (TDAPC).

For the electron transporting layer which is in contact with the cathode and with the mixed layer, the following are preferably used: 2-(4-biphenylyl)-5-(tert.-butylphenyl)-1,3,4-oxadiazole (butyl-PBD), 2-(4-biphenylyl)-5-phenyl-1,3,4-oxadiazole (PBD), or 5-(4-biphenylyl)-3-(tert.-butylphenyl)-1,2,4-triazole (TAZ).

Metals with a low work function are used as materials for the cathode because electrons are to be injected into the electron transporting layer from the cathode. Such metals are aluminum, magnesium, and alloys of magnesium with silver or indium, and calcium, alkali metals such as Li, Na, K, Cs, or rare earth metals such as europium or terbium.

The electron transporting or hole transporting materials may be provided from a solution, vapor-deposited in high vacuum, sublimated, or polymerized in situ for manufacturing the mixed layer. The hole transporting and the electron transporting compounds are jointly deposited so that a homogeneous intermixing is achieved in the mixed layer.

A DC voltage is applied to the two electrodes during operation. The first electrode will then be at a positive potential (anode), the second at a negative potential (cathode). When the voltage present across the mixed layer has exceeded a threshold value, positive charge carriers, i.e. holes, are injected from the anode into the material forming the exciplex. Negative charge carriers, i.e. electrons, are injected from the cathode. These charge carriers recombine in the mixed layer and thus supply the excitation energy for the exciplex. The excitation energy is given off again in the form of radiation. The hole transporting and electron transporting compounds used in accordance with the invention emit in the ultraviolet or blue spectrum range when used as single substances, but in the green or yellow spectrum range when combined into an exciplex. The combination of MTDATA and PBD or butyl-PBD in particular show a very strong green exciplex emission.

Test samples having an emission surface of 0.5 cm diameter were manufactured for finding the characteristics of the components, and the current-voltage curve, the current-luminance curve, and the emission spectrum are measured.

Figure 10:
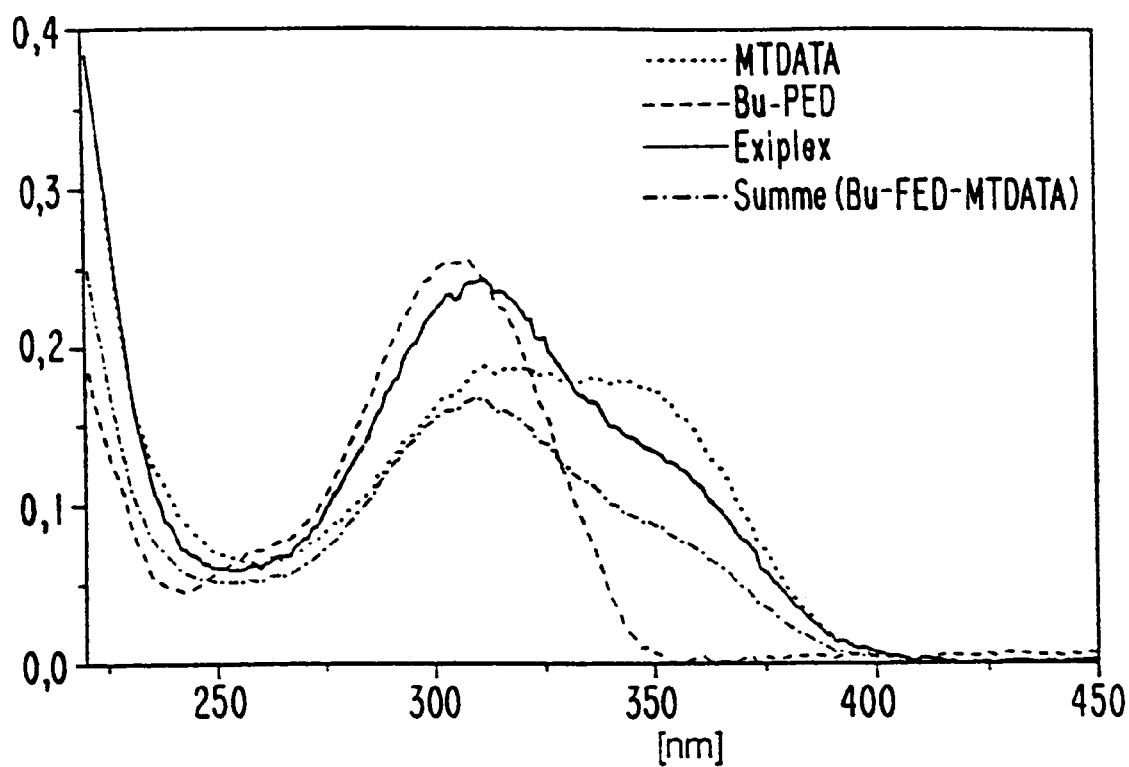
FIG. 10 shows the absorption spectrum of an exciplex compared with the absorption spectra of the basic compounds.

To measure the absorption spectrum, solutions of the combination of MTDATA with butyl-PBD according to the invention and solutions of the two basic compounds in polymethacrylic-acid-methylester are provided in a spin-coating process on a quartz glass substrate for measuring the absorption spectrum. FIG. 10 shows the absorption spectra of the single components MTDATA and butyl-PBD, the spectrum obtained through mathematical summing of those of MTDATA and butyl-PBD, and the spectrum of the combination of MTDATA and butyl-PBD. The summed spectrum and the spectrum of the combination are identical. This renders it clear in conjunction with the emission spectra that a genuine exciplex formation obtains here, and not a charge transfer complex. Both the emission and the absorption are indicated in relative units.

Embodiment 1

A glass plate with a layer of indium-doped tin oxide thereon is rinsed with a KOH/ethanol solution and subsequently with deionized water and ethanol for cleaning. It is dried and treated for 15 minutes in a UV ozonizer. Then the following layers are vapor-deposited in high vacuum at $5 \times 10^{-6}$ mbar: MTDATA as the hole transporting layer, layer thickness 250 nm, MTDATA and TAZ in a molar ratio of 1:1 as the mixed layer with a thickness of 600 nm, TAZ as the electron transporting layer with a layer thickness of 280 nm, Ca as the cathode with a layer thickness of 250 nm, and Al with a layer thickness of 880 nm.

Figure 4:
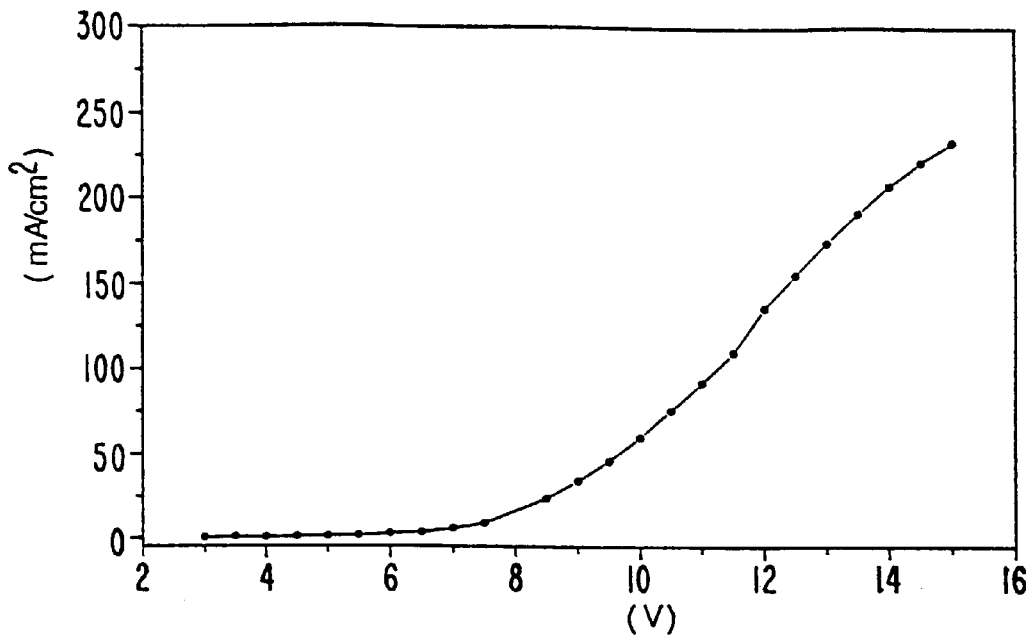
FIG. 4 shows the current-voltage characteristic of Embodiment 1.
Figure 5:
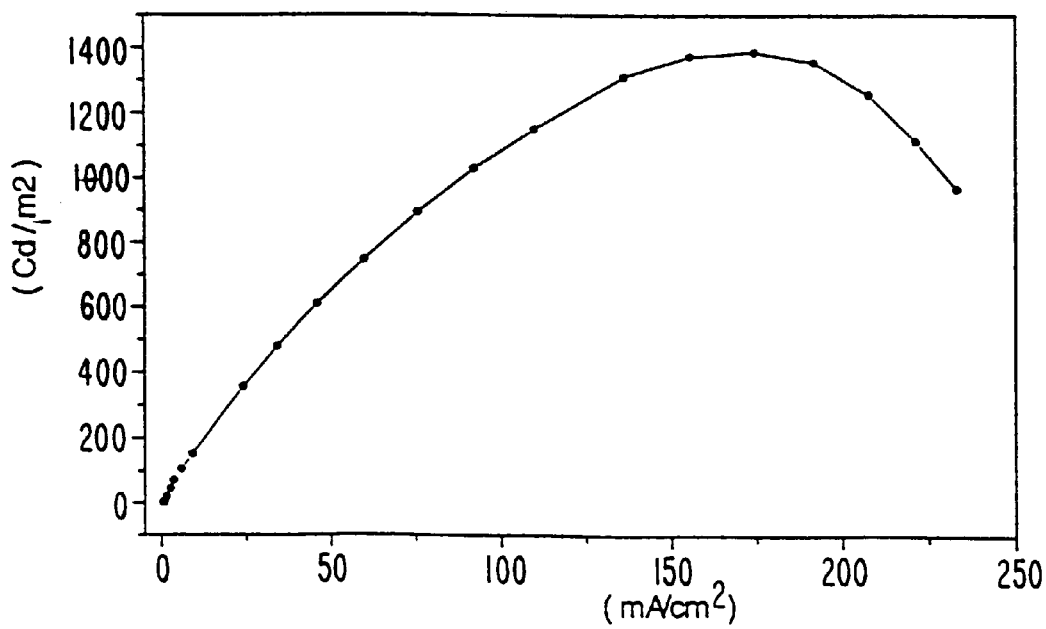
FIG. 5 shows the current-luminance characteristic of Embodiment 1.
Figure 6:
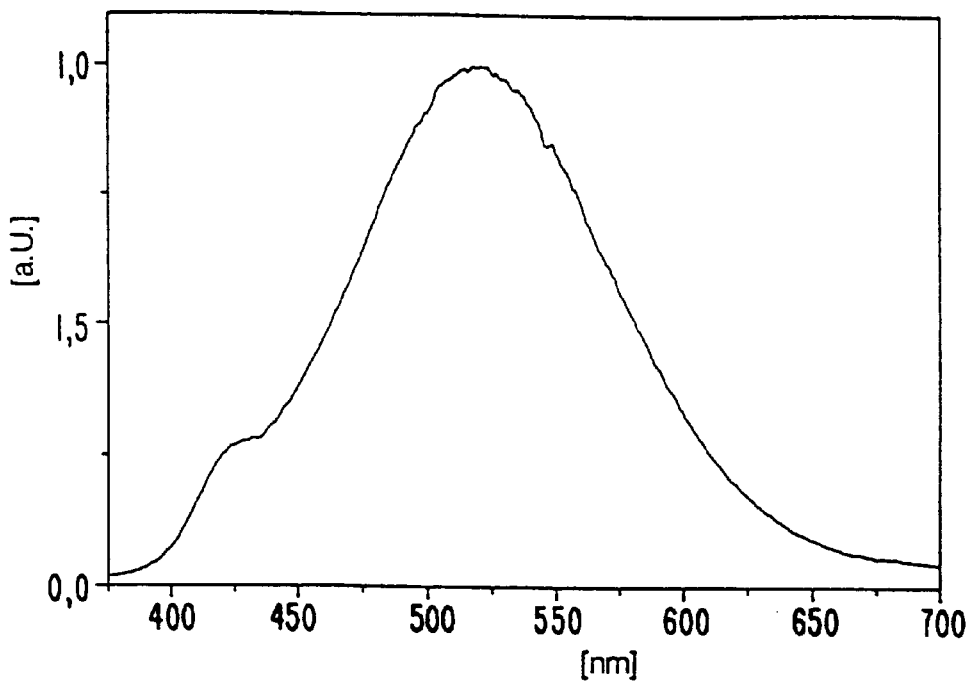
FIG. 6 shows the emission spectrum of Embodiment 1.

A luminance of 700 cd/m² was found at a current of 50 mA/cm² when a voltage of 10 V was applied. The current-voltage characteristic is shown in FIG. 4, the current-luminance curve in FIG. 5, and the emission spectrum in FIG. 6.

Embodiment 2

A glass plate with a layer of indium-doped tin oxide thereon is cleaned and pretreated as described with reference to Embodiment 1. Then the following layers are vapor-deposited in high vacuum at 5×10⁻⁶ mbar: MTDATA as the hole transporting layer with a layer thickness of 200 nm, MTDATA and butyl-PBD in a molar ratio of 3:1 as the mixed layer with a layer thickness of 513 nm, TAZ as the electron transporting layer with a layer thickness of 290 nm, Ca as the cathode with a layer thickness of 250 nm, and Al with a layer thickness of 2000 nm.

Figure 7:
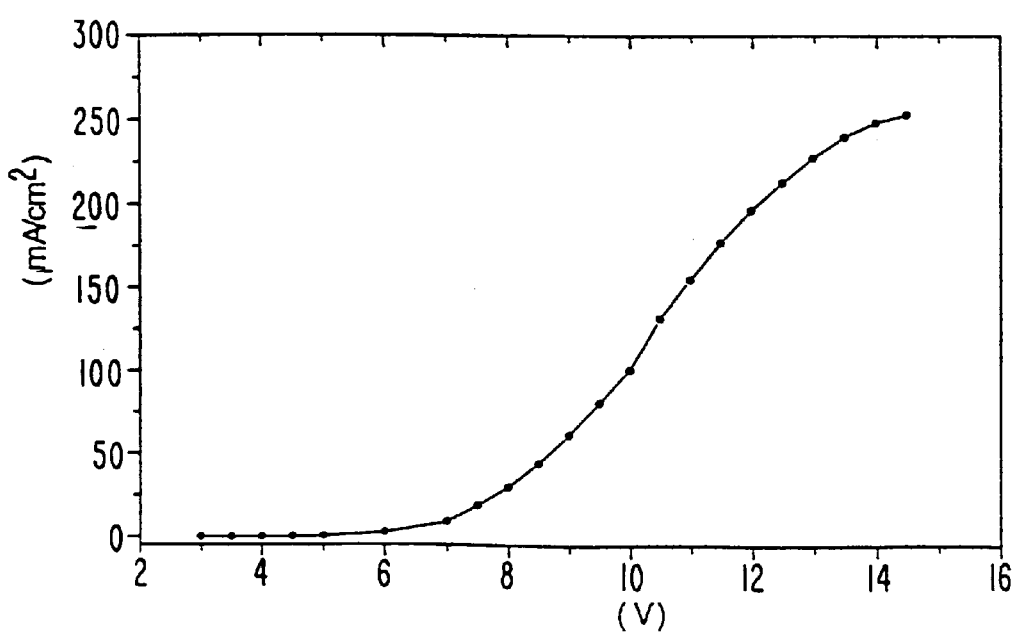
FIG. 7 shows the current-voltage characteristic of Embodiment 2.
Figure 8:
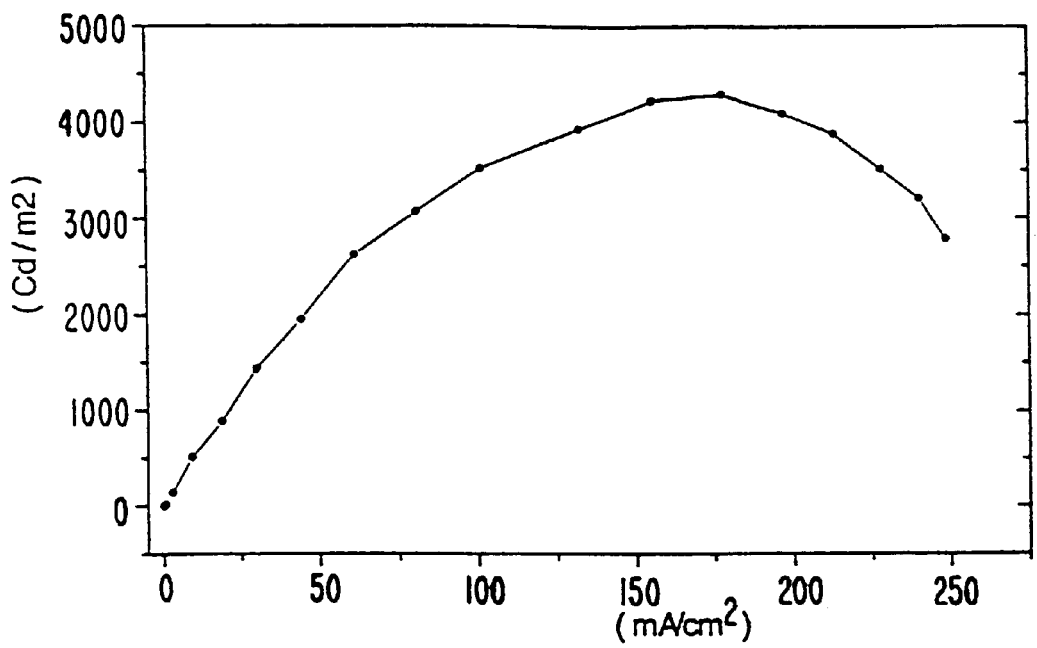
FIG. 8 shows the current-luminance characteristic of Embodiment 2.
Figure 9:
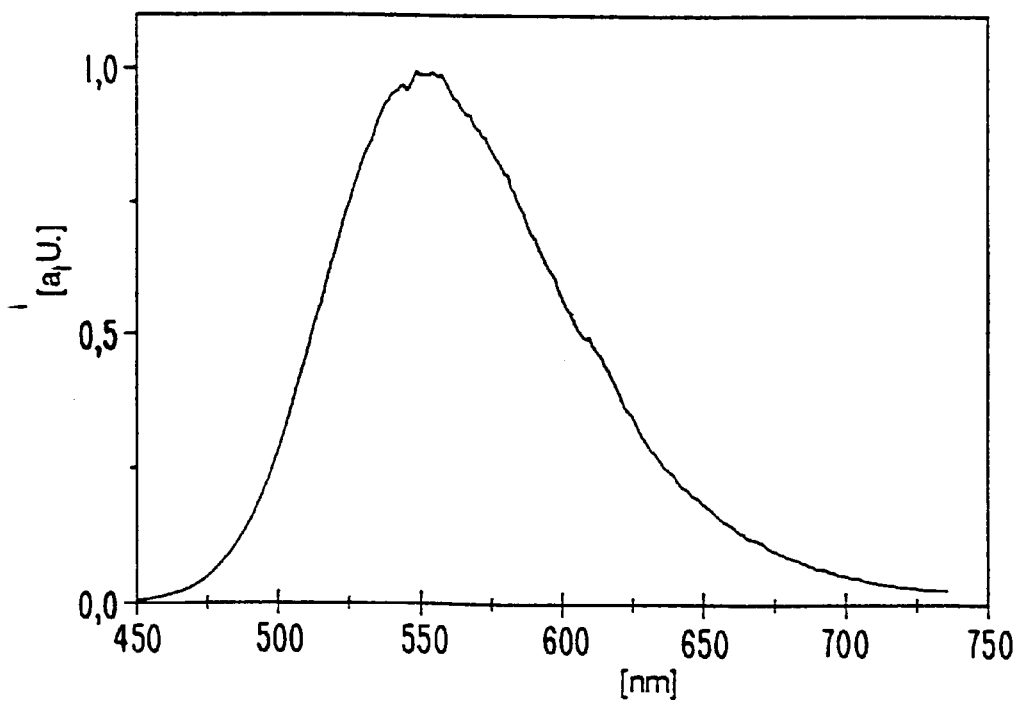
FIG. 9 shows the emission spectrum of Embodiment 2.

A luminance of 4200 cd/m² was found at a current of 175 mA/cm² when a voltage of 11 V was applied. The current-voltage characteristic is shown in FIG. 7, the current-luminance curve in FIG. 8, and the emission spectrum in FIG. 9.

We claim:

1. A organic electroluminescent component with a transparent substrate, a first transparent electrode, an organic electroluminescent layer which is a mixed layer comprising a mixture of a hole transporting and an electron transporting organic material which forms an exciplex, and a second electrode, wherein the mixture forming an exciplex comprises as the hole transporting material one or several compounds from the group 4,4',4"-tris(3-methylphenylphenylamino)-triphenyl amine (MTDATA), N,N'-diphenyl-N,N'-bis(3-methylphenyl)-1,1'-biphenyl-4,4'-diamine (TPD), N,N'-di(4-methylphenyl)-N,N'-diphenyl-1,4-phenylenediamine (DPPD), and 1,1'-bis-(4'-bis-(4'-methylphenyl)-aminophenyl)-cyclohexane (TDAPC), and as the electron transporting material one or several compounds from the group 2-(4-biphenylyl)-5-(tert.-butylphenyl)-1,3,4-oxadiazole (butyl-PBD), 2-(4-biphenylyl)-5-phenyl-1,3,4-oxadiazole (PBD), and 5-(4-biphenylyl)-3-(tert.-butylphenyl)-1,2,4-triazole (TAZ).

2. An organic electroluminescent component as claimed in claim 1, wherein the hole transporting material is 4,4',4"-tris(3-methylphenylphenylamino)-triphenylamine (MTDATA) and the electron transporting material is 5-(4-biphenylyl)-3-(tert.-butylphenyl)-1,2,4-triazole (TAZ).

3. An organic electroluminescent component as claimed in claim 1, wherein a layer of a hole transporting organic material is arranged between the first electrode and the mixed layer.

4. An organic electroluminescent component as claimed in claim 1, wherein a layer of an electron transporting organic material is arranged between the second electrode and the mixed layer.

5. An organic electroluminescent component as claimed in claim 1, wherein a layer of a hole transporting organic material is arranged between the first electrode and the mixed layer, and a layer of an electron transporting organic material is arranged between the second electrode and the mixed layer.

6. An organic electroluminescent component as claimed in claim 1, wherein the hole transporting material is 4,4',4"-tris(3-methylphenylphenylamino)-triphenylamine (MTDATA) and the electron transporting material is 2-(4-biphenylyl)-5-(tert.-butylphenyl)-1,3,4-oxadiazole (butyl-PBD), 2-(4-biphenylyl)-5-phenyl-1,3,4-oxadiazole (PBD).

7. An organic electroluminescent component with a transparent substrate; a first transparent electrode; as a hole transporting layer 4,4',4"-tris(3-methylphenylphenylamino)-triphenylamine (MTDATA); an organic electroluminescent layer which is a mixed layer comprising a mixture of 4,4',4"-tris(3-methylphenylphenylamino)-triphenylamine (MTDATA) and 5-(4-biphenylyl)-3-(tert.-butylphenyl)-1,2,4-triazole (TAZ) which forms an exciplex; as an electron transporting layer 5-(4-biphenylyl)-3-(tert.-butylphenyl)-1,2,4-triazole (TAZ); and a second electrode.

8. An organic electroluminescent component with a transparent substrate; a first transparent electrode; as a hole transporting layer 4,4',4"-tris(3-methylphenylphenylamino)-triphenylamine (MTDATA); an organic electroluminescent layer which is a mixed layer comprising a mixture of 4,4',4"-tris(3-methylphenylphenylamino)-triphenylamine (MTDATA) and 2-(4-biphenylyl)-5-(tert.-butylphenyl)-1,3,4-oxadiazole (butyl-PBD) which forms an exciplex; as an electron transporting layer 5-(4-biphenylyl)-3-(tert.-butylphenyl)-1,2,4-triazole (TAZ); and a second electrode.

9. An organic electroluminescent component as claimed in claim 7, wherein the first electrode is an Indium-doped tin oxide.

10. An organic electroluminescent component as claimed in claim 8, wherein the first electrode is an Indium-doped tin oxide.

* * * * *